United States Patent [19]

De Givry

[11] Patent Number: 5,612,575

[45] Date of Patent: Mar. 18, 1997

[54] METHOD OF CONNECTING THE OUTPUT PADS ON AN INTEGRATED CIRCUIT CHIP, AND MULTICHIP MODULE THUS OBTAINED

[75] Inventor: Jacques De Givry, Les Loges en Josas, France

[73] Assignee: Matra Marconi Space France, Paris, France

[21] Appl. No.: 441,747

[22] Filed: May 16, 1995

[30] Foreign Application Priority Data

May 20, 1994 [FR] France .................................. 94 06183

[51] Int. Cl.⁶ ........................... H01L 23/48; H01L 23/52; H01L 23/40

[52] U.S. Cl. ........................................... 257/786; 257/723

[58] Field of Search ..................................... 257/781, 780, 257/784, 786, 779, 773, 723, 724

[56] References Cited

U.S. PATENT DOCUMENTS

| | | |
|---|---|---|
| 4,755,866 | 5/1988 | Marshall et al. . |
| 5,126,286 | 6/1992 | Chance .................... 257/786 |
| 5,250,840 | 10/1993 | Oh et al. .................. 257/786 |
| 5,384,487 | 1/1995 | Kostoker et al. ........... 257/786 |
| 5,384,488 | 1/1995 | Golsham et al. ........... 257/786 |

FOREIGN PATENT DOCUMENTS 8504521  10/1985  WIPO .

OTHER PUBLICATIONS

Patent Abstract of Japan—vol. 17, n° 213, Apr. 26, 1993, JP-A-4 350 961 (Hitachi Ltd).

*Primary Examiner*—Mahshid Saadat
*Assistant Examiner*—S. V. Clark
*Attorney, Agent, or Firm*—Larson and Taylor

[57] ABSTRACT

The chip is fixed to a substrate by its lower face. At least one wire-bonding adaptor in the form of a board is used, the upper face of which has first bonding pads along at least one first edge and second bonding pads along at least one second edge, and including electrical connections between the first and second bonding pads. The wire-bonding adaptor is adhesively bonded by its lower face to the upper face of the chip so that the said first edge is adjacent to a row of output pads located elsewhere than on the periphery of the upper face of the chip and so that the said second edge is adjacent to the periphery of the chip. Bonding wires are bonded, on the one hand, between the output pads of the said row and the first bonding pads and, on the other hand, between the second bonding pads and conducting pads on the substrate.

4 Claims, 4 Drawing Sheets

METHOD OF CONNECTING THE OUTPUT PADS ON AN INTEGRATED CIRCUIT CHIP, AND MULTICHIP MODULE THUS OBTAINED

BACKGROUND OF THE INVENTION

The present invention relates to a method of connecting the output pads on an integrated-circuit chip and to a multichip module produced by using this method.

The most common way of arranging the bonding pads of integrated circuits is on the periphery of the latter. This allows short connections to be made to the circuit-supporting substrate. The main exception occurs in certain memories: the output pads 10 may be located elsewhere than on the periphery, for example along a mid-axis of the silicon chip 12 (FIGS. 1 and 2).

FIG. 3 shows an arrangement of the pads 14 in two rows on either side of the short axis of the chip 16; a few optional pads 18, generally with axial-pad redundancy, may be arranged on the periphery (this is the case for chips which are to be mounted by the so-called "flip-chip" or "C4" method). These arrangements are provided for mounting chips in the upside-down position (flip-chips) or for the wire-bonding of a lead frame laid on the chip and forming the outputs of an overmoulded package.

Such an axial arrangement of the pads leads to the impossibility of direct wire-bonding using aluminium or gold wires, as used conventionally.

The reason for this is that the wiring standards generally require a maximum distance between the ends of each bonded wire, for example less than 125 times the wire diameter (military standards) or 100 times the diameter (space standards). It is obvious that, with large chips (10 to 20 mm along the long side and 6 to 9 mm along the short side), it is increasingly problematical to carry out the wire-bonding with normal wires (diameters of 25 to 38 µm), in particular in the configuration of FIG. 1, where a fan-out of the wires is necessary. In fact, in the example in FIG. 4, it may be seen that the wires d,d' may be longer than 5 mm.

A second drawback of these axial arrangements resides in the fact that it is impossible to mount the chips one on top of the other according to the so-called "crossed pairs" methods (see EP-A-0,489 643). The reason for this is that the upper chips then cover the output pads of the lower chips. One way of getting round this problem could be provided by a tile arrangement of rerouted chips (see EP-A-0,614,190). The rerouting of the outputs is achieved by depositing thin layers of the polyimide/copper type on that face of the chip having the output pads, which depositions, apart from their relative complexity have the drawback of being able to be carried out only by the chip manufacturer and not by the assembler.

In addition to the flip-chip, lead frame and rerouting methods mentioned hereinabove, it is also known, in order to connect the axial output pads on a memory chip, to adhesively bond the chip in the upside-down position on a ceramic substrate having an opening opposite the output pads on the chip. This latter solution allows several chip/substrate pairs to be stacked up in a superposed mounting, each substrate being equipped with lateral connections for connecting to a "squirrel cage" surrounding the assembly. The edges of the opening in the substrate opposite the output pads on the chip must be staged, by having a step to allow sufficiently compact stacking of the chip/substrate pairs. This opening is therefore difficult to produce. It involves, in particular, producing the substrate by means of co-fired layers. Furthermore, that portion of the lower face of the adjacent chip of the stack located opposite this opening is not in good thermal contact with a material promoting the removal of heat.

The object of the invention is to provide a novel technique for connecting the output pads on an integrated-circuit chip which reduces the impact of at least some of the problems mentioned hereinabove.

SUMMARY OF THE INVENTION

The invention thus provides a method of connecting the output pads on an integrated-circuit chip fixed to a substrate by its lower face, the output pads being arranged on the upper face of the chip, and at least some of the output pads being located elsewhere than on the periphery of the upper face of the chip. At least one wire-bonding adaptor in the form of a board is used, the upper face of which has first bonding pads along at least one first edge and second bonding pads along at least one second edge, and including electrical connections between the first and second bonding pads. The wire-bonding adaptor is adhesively bonded by its lower face to the upper face of the chip so that the said first edge is adjacent to a row of output pads located elsewhere than on the periphery of the upper face of the chip and so that the said second edge is adjacent to the periphery of the chip. Bonding wires are bonded, on the one hand, between the output pads of the said row and the first bonding pads and, on the other hand, between the second bonding pads and conducting pads on the substrate. The wire-bonding adaptor is, for example, a thin ceramic board equipped with screen-printed conductors, or a silicon substrate with aluminium connections or else a flexible printed circuit of the polyimide/copper type, etc. Two adaptors may be mounted on either side of one axis of the chip when the chip has output pads along this axis.

The invention furthermore makes it possible to stack chips in a three-dimensional configuration.

Thus, in a first version of a multichip module according to the invention, in which the chips have a rectangular shape and each includes a row of output pads parallel to its long sides, at least two chips are adhesively bonded to the substrate with their short sides aligned and two respective long sides adjacent in order to form a first stage of chips, at least one additional chip is adhesively bonded by its lower face to the upper faces of two adjacent chips of the first stage in order to form a second stage, the chip of the second stage being positioned with its short sides aligned with those of the subjacent chips and its long sides offset so as to leave the rows of output pads on the subjacent chips exposed, a first wire-bonding adaptor is adhesively bonded to that part of the upper face of a first chip of the first stage left exposed by the chip of the second stage, and a second wire-bonding adaptor is adhesively bonded to the chip of the second stage, the second edge of the second wire-bonding adaptor being adjacent to that long side of the chip of the second stage located above the said first chip of the first stage, each of the wire-bonding adaptors having its first and second bonding pads arranged respectively along two opposite edges, parallel to the long sides of the chips, and connected by electrical connections parallel to the short sides of the chips. First bonding wires are bonded between the first bonding pads on the first wire-bonding adaptor and the output pads on the first chip of the first stage, second bonding wires are bonded between the first bonding pads on the second wire-bonding adaptor and the output pads on the chip of the second stage, third bonding wires are bonded between the second bonding pads on the second wire-bonding adaptor and the first bonding pads on the first wire-bonding adaptor and fourth bonding wires are bonded between the second bonding pads on the first wire-bonding adaptor and conducting pads on the substrate.

In another configuration, in which the chips have an elongate rectangular shape and each includes at least one row of output pads, parallel to its short sides, located in the vicinity of a mid-axis, at least two chips are adhesively bonded to the substrate with their short sides and their rows of output pads aligned and two respective long sides adjacent in order to form a first stage of chips, at least two additional chips are adhesively bonded by their lower face to the upper faces of two adjacent chips of the first stage in order to form a second stage of chips, the chips of the second stage being positioned with their short sides and their rows of output pads aligned parallel to the direction of the long sides of the subjacent chips and with two respective long sides spaced apart so as to leave the rows of output pads on the subjacent chips exposed, and at least two wire-bonding adaptors are adhesively bonded respectively to the two chips of the second stage in diagonally opposed positions, each of these wire-bonding adaptors having first bonding pads which are distributed along two perpendicular edges respectively adjacent to a row of output pads on the chip to which it is adhesively bonded and to a row of output pads on one of the subjacent chips and are respectively connected to the output pads of these rows by bonded bonding wires.

DESCRIPTION OF PREFERRED EMBODIMENTS

Figure 3:
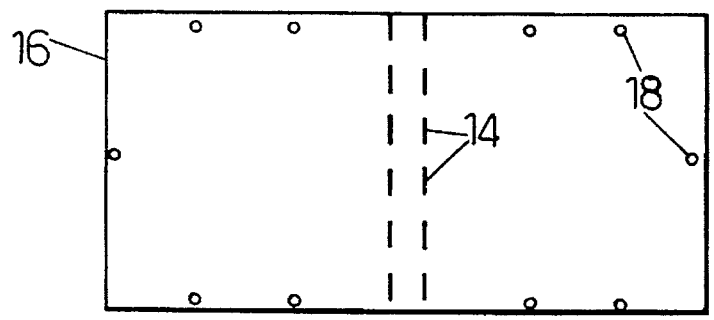
Figure 4:
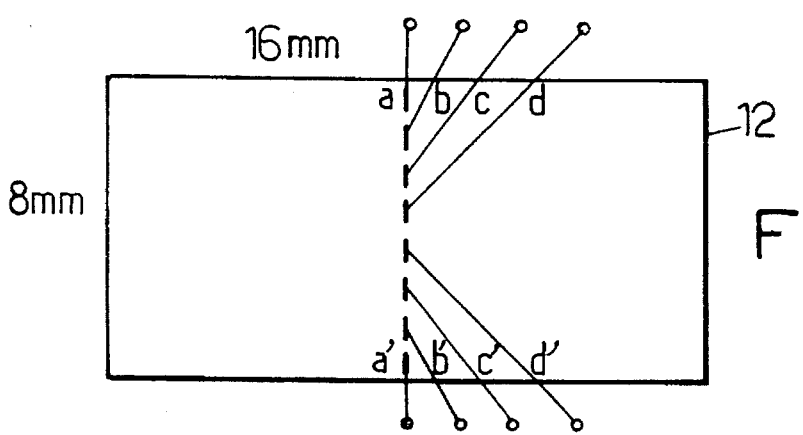
Figure 5:
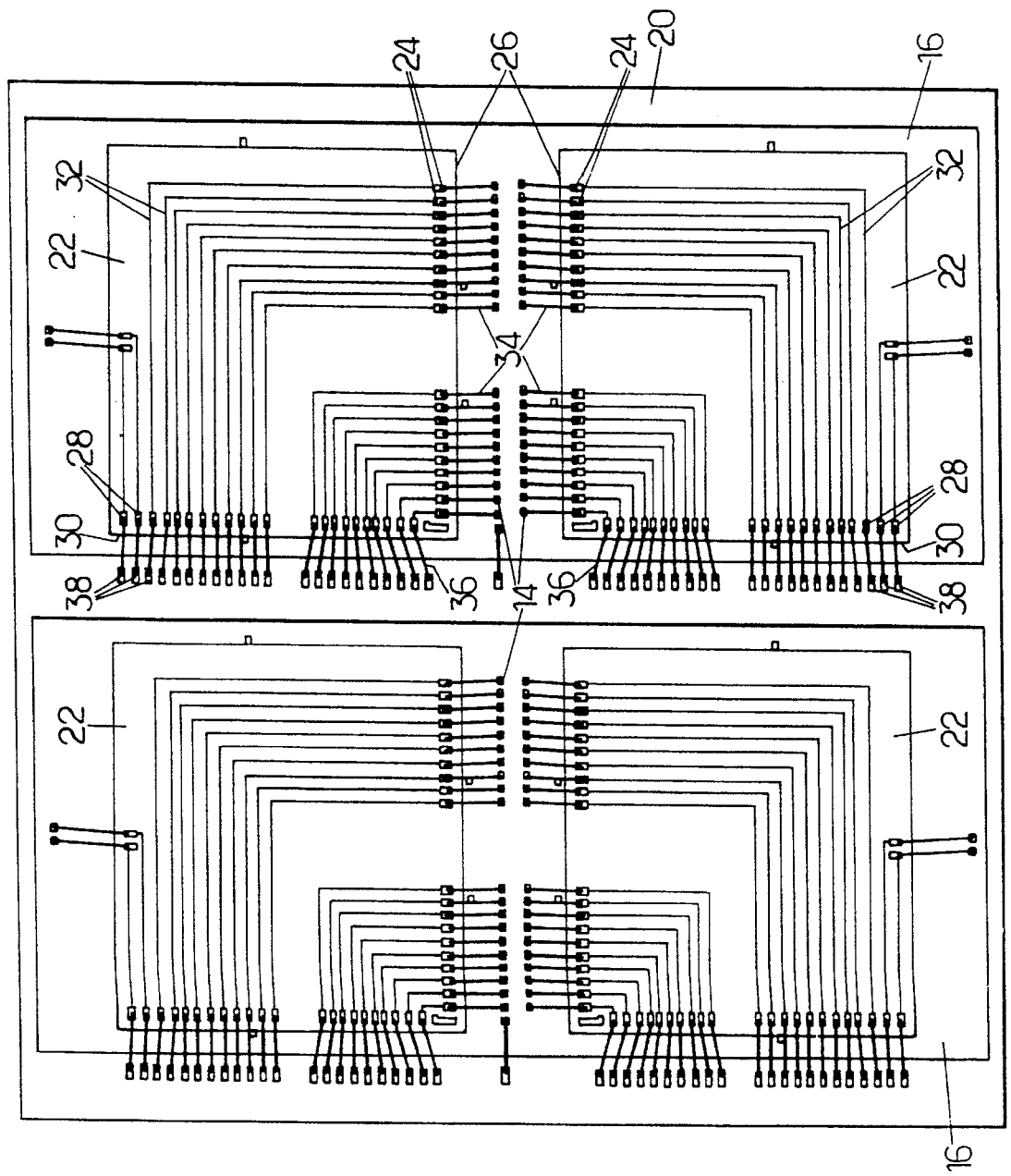
FIG. 5 is a view from above of a first embodiment of a multichip module according to the invention.

In the embodiment shown in FIG. 5, two chips 16 of the type illustrated in FIG. 3 are adhesively bonded by their lower face to a substrate 20. They are positioned with their short sides and their rows of output pads 14 aligned. Adhesively bonded to each of these two pads 16 are two square-shaped wire-bonding adaptors 22 each occupying approximately half the area of the corresponding chip. Each wire-bonding adaptor 22 has bonding pads 24 arranged along a first edge 26 and other bonding pads 28 arranged along a second edge 30 perpendicular to the first edge 26. The bonding pads 24 and 28 are connected together by conducting tracks 32.

The first edge 26 of each adaptor 22 is arranged beside a row of output pads 14 on the subjacent chip and bonding wires 34 are bonded between the bonding pads 24 adjacent to this first edge 26 and the output pads 14 of this row. The second edge 30 of each adaptor 22 is arranged beside the periphery of the subjacent chip, along its long side. Bonding wires 36 are bonded between the connection pads 28 adjacent to this second edge 30 and conducting pads 38 provided on the substrate 20 beside the long side of the chip. Thus, the axial output pads 14 on the chips are connected to the substrate via the wires 34, 36, bonding pads 24, 28 and tracks 32, it being possible for the wires 34, 36 to be relatively short by virtue of the wire-bonding adaptors.

The substrate 20 includes conductors, not shown, for connecting the conducting pads 38 to the surround of the module.

The wire-bonding adaptor 22 is, for example, made from a thin ceramic board on which the bonding pads 24, 28 and the conductor tracks 32 are produced using a conventional thick-film screen-printing technique. An electrically insulating adhesive of high purity is used to adhesively bond the wire-bonding adaptors 22, this adhesive having a moderate flexibility in order to allow absorption of differential expansions while at the same time only damping the ultrasonic energy slightly during the operation of bonding the bonding wires 34, 36. It may be an adhesive of a type commonly used in mounting hybrid circuits, for example that known by the name Epoteck or Ablefilm, etc.

Figure 2:
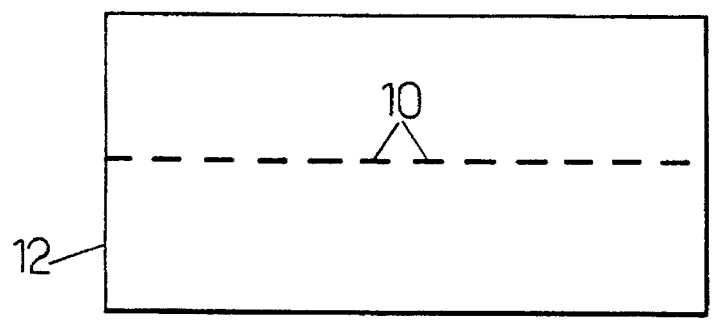
Figure 6:
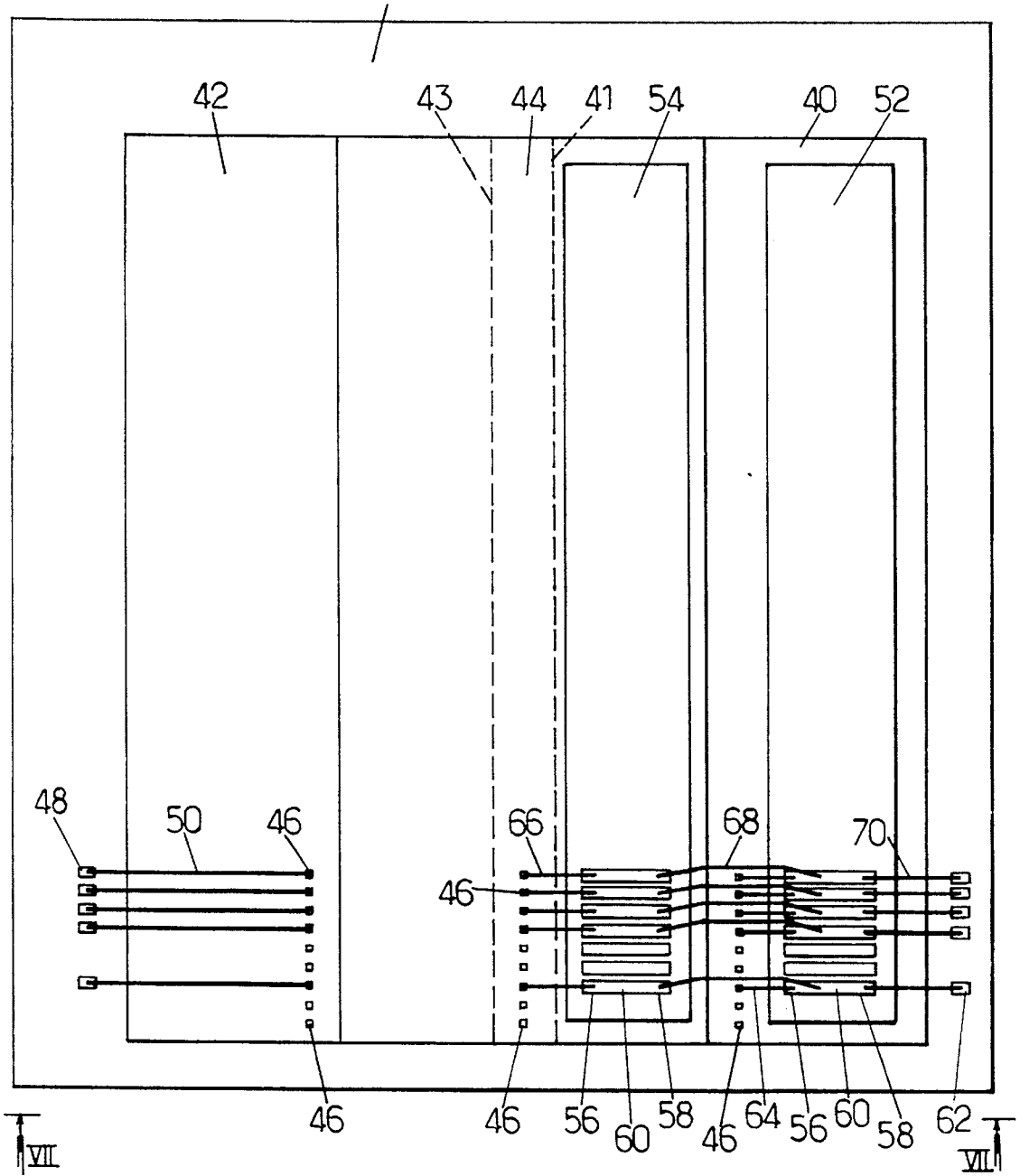
FIG. 6 is a view from above of a second embodiment of a multichip module according to the invention.
Figure 7:
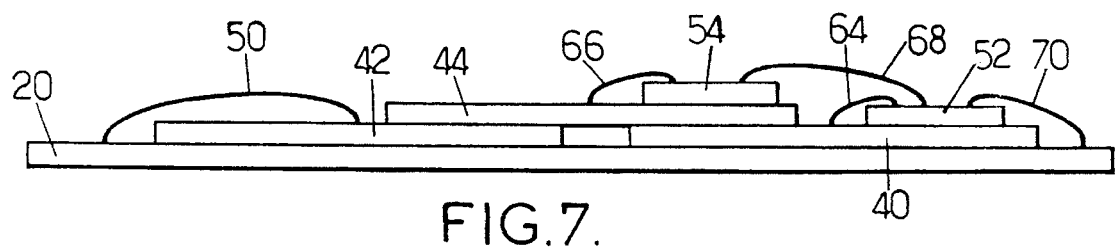
FIG. 7 is a diagrammatic elevation view of the module of FIG. 6, along the direction VII indicated in FIG. 6.

FIGS. 6 and 7 show a configuration of three chips of the type illustrated in FIG. 2 on a substrate 20. In order to simplify FIG. 6, the chip connections have only been drawn on the lower part of the figure. A first stage of chips is formed by two rectangular chips 40, 42 adhesively bonded to the substrate 20 by their lower face with their short sides aligned and two respective long sides 41, 43 adjacent. A second stage is formed by an additional chip 44 adhesively bonded by its lower face to the upper faces of the chips 40, 42 of the first stage. The chip 44 of the second stage is positioned with its short sides aligned with those of the subjacent chips 40, 42. Each chip 40, 42, 44 includes a row of axial output pads 46 parallel to its long sides. The chip 44 of the second stage is positioned so as to leave the axial output pads 46 on the chips of the first stage exposed.

As the left-hand side parts of FIGS. 6 and 7 show, the chips are narrow enough to allow wire-bonding directly to the substrate from the axial output pads on the chips of the first stage to the conducting pads 48 on the substrate 20 by means of bonding wires 50 parallel to the short sides, these bonding wires 50 not having too great a length/diameter ratio.

On the other hand, such direct wire-bonding is not possible for the chip 44 of the second stage. The arrangement in FIGS. 6 and 7 therefore uses two wire-bonding adaptors 52, 54 of elongate rectangular shape (typically 2.5×15 mm approximately). The first adaptor 52 is adhesively bonded to that part of the upper face of the chip 40 left exposed by the chip 44. The second adaptor 54 is adhesively bonded to the chip 44 of the second stage, on the side of the chip 40. Each adaptor 52, 54 has its first 56 and second 58 bonding pads arranged respectively along two opposite edges parallel to the long sides of the chips and connected together by conducting tracks 60 parallel to the short sides of the chips. Four series of bonding wires 64, 66, 68, 70 are used to connect the output pads 46 on the chips 40 and 44 to conducting pads 62 on the substrate 20. The wires 64 connect the first bonding pads 56 on the adaptor 52 to the output pads 46 on the chip 40. The wires 66 connect the first bonding pads 56 on the adaptor 54 to the output pads 46 on the chip 44 of the second stage. The wires 68 connect the second bonding pads 58 on the adaptor 54 to the first bonding pads 56 on the adaptor 52. Finally, the wires 70 connect the second bonding pads 58 on the adaptor 52 to the conducting pads 62 on the substrate 20. It may therefore be seen that the wire-bonding adaptors 52, 54 allow connection of the output pads 46 in a three-dimensional arrangement with relatively short bonding wires.

Figure 8:
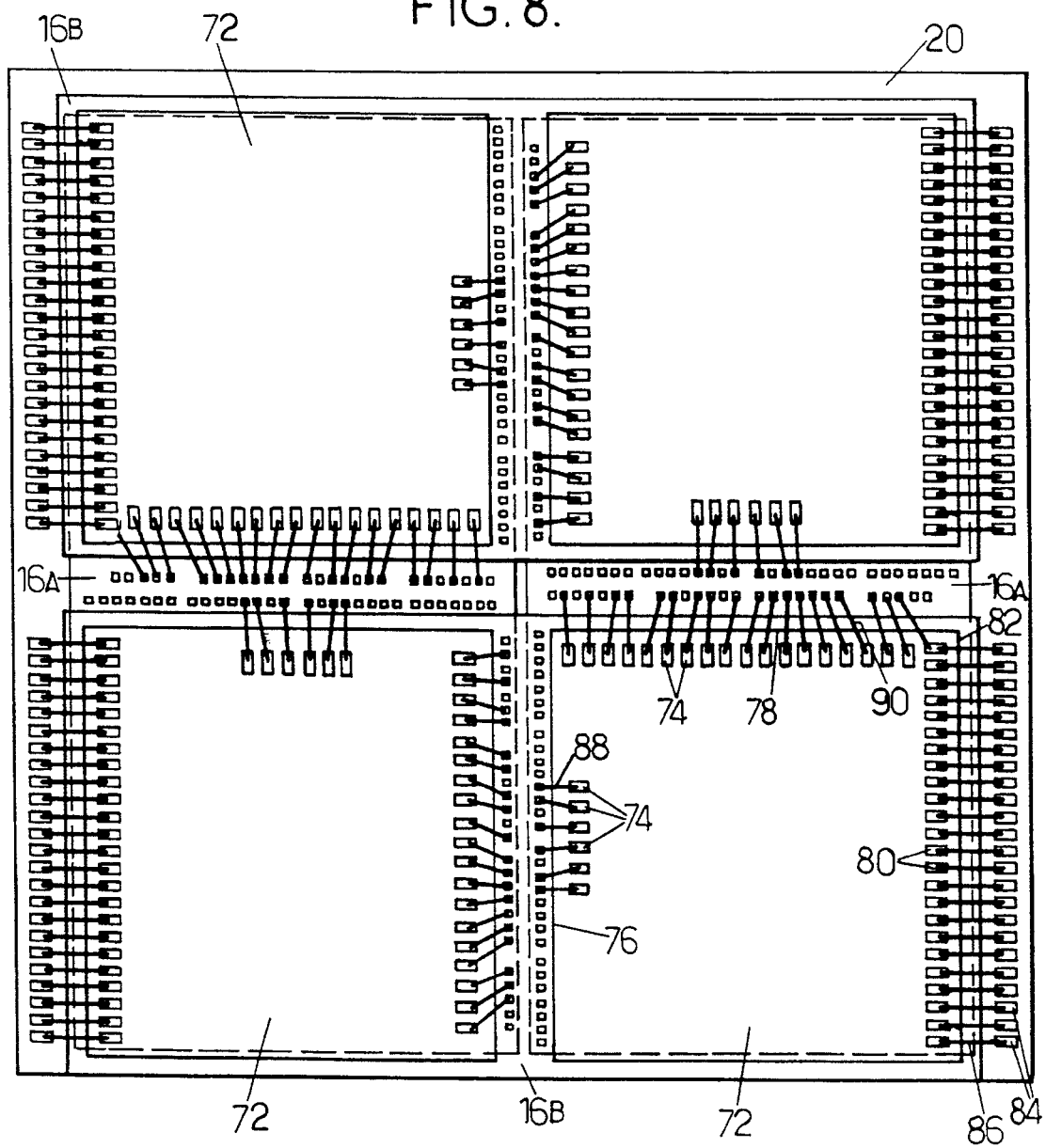
FIGS. 8 and 9 are views, respectively from above and in elevation, of a third embodiment of a multichip module according to the invention.
Figure 9:
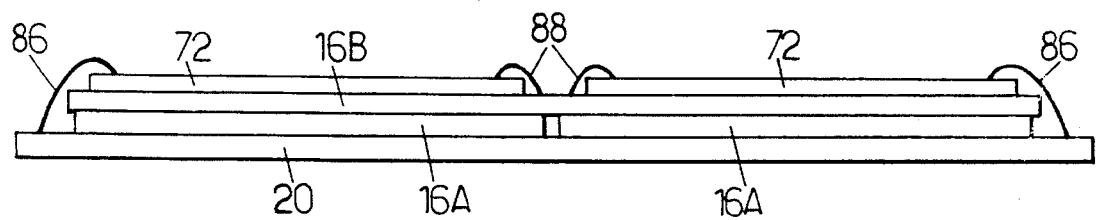

FIGS. 8 and 9 show a configuration of four chips 16 of the type illustrated in FIG. 3 on a substrate 20. This is also a three-dimensional arrangement. A first stage of chips is formed by two chips 16A adhesively bonded to the substrate with their short sides aligned as are their rows of output pads, and with two respective long sides adjacent. The second stage is formed by two chips 16B adhesively bonded by their lower face to the upper faces of the chips 16A of the first stage. The chips 16B are positioned in a crossed manner so as to leave the axial output pads on the chips 16A of the first stage exposed. Thus, the short sides and the rows of output pads on the chips 16B of the second stage are aligned parallel to the direction of the long sides of the subjacent chips and their long sides are spaced at the central part of the arrangement.

The arrangement of FIGS. 8 and 9 uses four squareshaped wire-bonding adaptors 72 adhesively bonded to the upper faces of the chips 16B of the second stage. Each adaptor 72 has first bonding pads 74 distributed along two perpendicular edges 76, 78 and second bonding pads 80 distributed along another edge 82. This edge 82 is adjacent to the short side of the chip 16B which is itself adjacent to conducting pads 84 on the substrate 20. Bonding wires 86 are bonded between the second bonding pads 80 on the adaptors 72 and the adjacent conducting pads 84 on the substrate. Each adaptor 72 has its edge 76 adjacent to the closest row of axial output pads 14 on the chip 16B to which it is adhesively bonded. Bonding wires 88 connect these output pads 14 to the first bonding pads 74 located along the edge 76. The edge 78 of each adaptor 72 is adjacent to a long side of the chip 16B to which it is adhesively bonded, itself adjacent to a row of output pads 14 on a subjacent chip 16A of the first stage. Bonding wires 90 connect these pads 14 to the first bonding pads 74 located along the edge 78.

An arrangement such as that in FIGS. 8 and 9 may, in some cases, necessitate crossovers between the conducting tracks connecting the first and second bonding pads 74, 80 in the wire-bonding adaptors. In such a case, the adaptors 72 are produced with several levels of conductors. These two levels may be obtained either by multilayer configurations on the same face of an insulating board or by configurations in which conducting planes are formed on the two opposite faces of an insulating board with plated-through holes connecting the two faces at the appropriate points. In this latter case, it is not necessary to insulate the adhesively bonded face with an additional dielectric layer, the electrical insulation function being provided by the passivation layer on the chip and by the adhesive. However, in most cases, the topology of the output pads to be connected will be compatible with wire-bonding adaptors having just one level of conductors.

Figure 1:
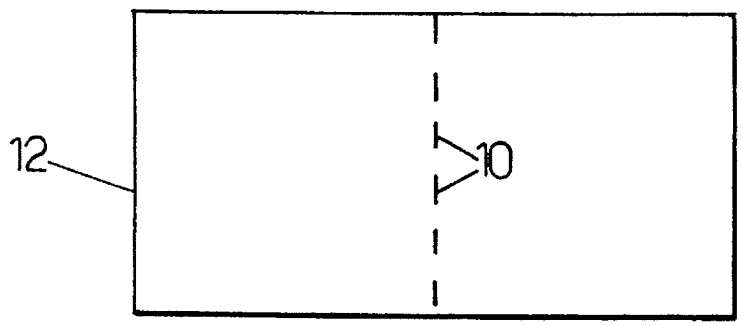
FIGS. 1 to 4, discussed previously, are diagrammatic views from above of various types of chips having output pads elsewhere than on the periphery.

Various alternative forms may be given to the embodiments described hereinabove, without departing from the scope of the invention. For example, if the chips in FIGS. 8 and 9 are replaced with chips of the type illustrated in FIG. 1, it is possible to adopt a similar arrangement in crossed pairs by using only two wire-bonding adaptors, such as 72, in diagonally opposite positions on the chips of the second stage.

In the arrangement in FIGS. 8 and 9, inserts may be added between the two stages of chips 16A, 16B. Insofar as these inserts have dimensions slightly less than those of the chips, it also becomes possible to wire-bond peripheral output pads on the chips of the first stage. This is also possible for the chips of the second stage if slightly narrower adaptors are used (for example those having the dimensions of the adaptors illustrated in FIG. 5). One or more insulating inserts may also be adhesively bonded to the adaptors 72, the function of these inserts being to protect the bonding wires 86, 88 should these be close to a metal cover (package).

I claim:

1. Multichip module, comprising a substrate, integrated-circuit chips each having a lower face fixed to the substrate and an upper face provided with output pads, at least some of the output pads of each chip being located other than on the periphery of the upper face of said chip, and connection means for connecting the output pads to the substrate, wherein the connection means comprise at least one wire-bonding adaptor in the form of a board, having an upper face with first bonding pads along at least one first edge thereof and second bonding pads along at least one second edge thereof, and including electrical connections between the first and second bonding pads, wherein the wire-bonding adaptor is bonded adhesively by a lower face thereof to the upper face of one of the chips so that said first edge is adjacent to a row of output pads located other than on the periphery of the upper face of said one of the chips, and so that said second edge is adjacent to the periphery of said one of the chips, and wherein bonding wires are bonded, on the one hand, between the output pads of said row and the first bonding pads and, on the other hand, between the second bonding pads and conducting pads on the substrate.

2. Multichip module according to claim 1, wherein, the chips being of rectangular shape and each including a row of output pads parallel to long sides thereof, at least two chips are adhesively bonded to the substrate with their short sides aligned and two respective long sides adjacent in order to form a first stage of chips, at least one additional chip is adhesively bonded by a lower face thereof to the upper faces of two adjacent chips of the first stage in order to form a second stage, the chip of the second stage being positioned with its short sides aligned with those of the subjacent chips and its long sides offset so as to leave the rows of output pads on the subjacent chips exposed, wherein a first wire-bonding adaptor is adhesively bonded to that part of the upper face of a first chip of the first stage left exposed by the chip of the second stage, and a second wire-bonding adaptor is adhesively bonded to the chip of the second stage, the second edge of the second wire-bonding adaptor being adjacent to that long side of the chip of the second stage located above said first chip of the first stage, each of the wire-bonding adaptors having its first and second bonding pads arranged respectively along two opposite edges, parallel to the long sides of the chips and connected by electrical connections parallel to the short sides of the chips, and wherein first bonding wires are bonded between the first bonding pads on the first wire-bonding adaptor and the output pads on the first chip of the first stage, second bonding wires are bonded between the first bonding pads on the second wire-bonding adaptor and the output pads on the chip of the second stage, third bonding wires are bonded between the second bonding pads on the second wire-bonding adaptor and the first bonding pads on the first wire-bonding adaptor, and fourth bonding wires are bonded between the second bonding pads on the first wire-bonding adaptor and conducting pads on the substrate.

3. Multichip module according to claim 1, wherein the chips have an elongate rectangular shape and each includes at least one row of output pads parallel to its short sides, located in the vicinity of a mid-axis, wherein at least two chips are adhesively bonded to the substrate with their short sides and their rows of output pads aligned and two respective long sides adjacent in order to form a first stage of chips, at least two additional chips are adhesively bonded by their lower face to the upper faces of two adjacent chips of the first stage in order to form a second stage of chips, the chips of the second stage being positioned with their short sides and their rows of output pads aligned parallel to the direction of the long sides of the subjacent chips and with two respective long sides spaced apart so as to leave the rows of output pads on the subjacent chips exposed, wherein at least two wire-bonding adaptors are adhesively bonded respectively to the two chips of the second stage in diagonally opposed positions, each of these wire-bonding adaptors having first bonding pads which are distributed along two perpendicular edges respectively adjacent to a row of output pads on the chip to which said adaptor is adhesively bonded and to a row of output pads on one of the subjacent chips and are respectively connected to the output pads of these rows by bonded bonding wires.

4. Multichip module according to claim 3, wherein the chips each include two rows of parallel output pads adjacent to their mid-axis and wherein each chip of the second stage has two wire-bonding adaptors adhesively bonded to its upper face, each occupying substantially half the area of said chip.

* * * * *